(12) United States Patent
Barrett et al.

(10) Patent No.: US 7,418,068 B2
(45) Date of Patent: Aug. 26, 2008

(54) DATA CAPTURE TECHNIQUE FOR HIGH SPEED SIGNALING

(75) Inventors: Wayne Melvin Barrett, Rochester, MN (US); Dong Chen, Croton On Hudson, NY (US); Paul William Coteus, Yorktwon Heights, NY (US); Alan Gene Gara, Mount Kisco, NY (US); Rory Jackson, Eastchester, NY (US); Gerard Vincent Kopcsay, Yorktown Hieghts, NY (US); Ben Jesse Nathanson, Teaneck, NY (US); Paylos Michael Vranas, Bedford Hills, NY (US); Todd E. Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 10/468,992

(22) PCT Filed: Feb. 25, 2002

(86) PCT No.: PCT/US02/05568

§ 371 (c)(1),
(2), (4) Date: Feb. 5, 2004

(87) PCT Pub. No.: WO02/069552

PCT Pub. Date: Sep. 6, 2002

(65) Prior Publication Data

US 2004/0114698 A1    Jun. 17, 2004

Related U.S. Application Data

(60) Provisional application No. 60/271,124, filed on Feb. 24, 2001.

(51) Int. Cl.
    *H04L 7/00*    (2006.01)

(52) U.S. Cl. ..................................... 375/355; 713/400
(58) Field of Classification Search ................. 375/255, 375/354, 355, 360, 371; 713/400, 401, 500, 713/600; 710/52; 365/230.04, 189.05, 189.08, 365/230.01, 233.1
See application file for complete search history.

(56) References Cited

U.S. PATENT DOCUMENTS

| 4,821,296 | A | * | 4/1989 | Cordell ..................... 375/374 |
| 5,144,525 | A | * | 9/1992 | Saxe et al. .................. 365/45 |
| 5,258,933 | A | * | 11/1993 | Johnson et al. ............... 708/3 |
| 5,278,873 | A | * | 1/1994 | Lowrey et al. ............. 375/371 |
| 5,459,766 | A |  | 10/1995 | Huizer et al. |
| 5,491,722 | A | * | 2/1996 | Jones et al. ................ 375/224 |

(Continued)

FOREIGN PATENT DOCUMENTS

JP           11-252063        9/1999

*Primary Examiner*—Chieh M. Fan
*Assistant Examiner*—Aristocratis Fotakis
(74) *Attorney, Agent, or Firm*—Scully, Scott, Murphy & Presser, P.C.; Daniel P. Morris, Esq.

(57) ABSTRACT

A data capture technique for high speed signaling to allow for optimal sampling of an asynchronous data stream. This technique allows for extremely high data rates and does not require that a clock be sent with the data as is done in source synchronous systems. The present invention also provides a hardware mechanism for automatically adjusting transmission delays for optimal two-bit simultaneous bi-directional (SiBiDi) signaling.

10 Claims, 16 Drawing Sheets

U.S. PATENT DOCUMENTS

| | | |
|---|---|---|
| 5,642,386 A | 6/1997 | Rocco, Jr. |
| 5,844,908 A | 12/1998 | McCallan |
| 5,852,600 A | 12/1998 | Russ |
| 5,968,180 A * | 10/1999 | Baco .......................... 713/400 |
| 6,031,886 A * | 2/2000 | Nah et al. ................... 375/375 |
| 6,108,794 A * | 8/2000 | Erickson .................... 713/401 |
| 6,112,283 A | 8/2000 | Neiger et al. |
| 6,341,326 B1 * | 1/2002 | Zhao et al. ................... 711/104 |
| 6,396,329 B1 * | 5/2002 | Zerbe .......................... 327/336 |
| 6,516,363 B1 * | 2/2003 | Porter et al. .................. 710/60 |
| 6,868,134 B2 * | 3/2005 | Yoshizaki ................... 375/354 |
| 6,996,201 B2 * | 2/2006 | Arima ......................... 375/355 |

* cited by examiner

Data Receive Macro Block

Data Send Macro Block

Even and odd clock phase data bit

Clock Delay Line

History Logic

Data and History Sample Muxes

Data and History Sample Muxes

Data and History Sample Muxes

Serial Bit combining and Byte Align Logic

Eye Detection Flow Diagram

Two Bit Macro State Diagram 1 of 2

DATA CAPTURE TECHNIQUE FOR HIGH SPEED SIGNALING

CROSS-REFERENCE

The present invention claims the benefit of commonly-owned, U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. U.S. patent application Ser. No. 10/468,999 filed Aug. 22, 2003, for "Class Networking Routing"; U.S. patent application Ser. No. 10/469,000 filed Aug. 22, 2003, for "A Global Tree Network for Computing Structures"; U.S. patent application Ser. No. 10/468,997 filed Aug. 22, 2003, "Global Interrupt and Barrier Networks"; U.S. patent application Ser. No. 10/469,001 filed Aug. 22, 2003, for "Optimized Scalable Network Switch"; U.S. Pat. No. 7,313,582 granted Dec. 25, 2007, for "Arithmetic Functions in Torus and Tree Networks"; U.S. patent application Ser. No. 10/468,992 filed Aug. 22, 2003, for "Data Capture Technique for High Speed Signaling"; U.S. patent application Ser. No. 10/468,995 filed Aug. 22, 2003, for 'Managing Coherence Via Put/Get Windows'; U.S. patent application Ser. No. 10/469,994 filed Aug. 22, 2003, for "Low Latency Memory Access And Synchronization"; U.S. Pat. No. 7,330,996 granted Feb. 12, 2008, for "Twin-Tailed Fail-Over for Fileservers Maintaining Full Performance in the Presence of Failure"; U.S. Pat. No. 7,210,088 granted Apr. 24, 2007, for "Fault Isolation Through No-Overhead Link Level Checksums"; U.S. patent application Ser. No. 10/469,003 filed Aug. 22, 2003, for "Ethernet Addressing Via Physical Location for Massively Parallel System"; U.S patent application Ser. No. 10/469,002 filed Aug. 22, 2003, for "Fault Tolerance in a Supercomputer Through Dynamic Repartitioning"; U.S. Pat. No. 6,895,416 granted May 17, 2005, for "Checkpointing Filesystem"; U.S. patent application Ser. No. 10/468,998 filed Aug. 22, 2003, for "Efficient Implementation of Multidimensional Fast Fourier Transform on a Distributed-Memory Parallel Multi-Node Computer"; U.S. patent application Ser. No. 10/468,993 filed Aug. 22, 2003, for "A Novel Massively Parallel Supercomputer"; and U.S. Pat. No. 6,592,449 granted Jul. 15, 2003, for "Smart Fan Modules and System".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

The present invention relates generally to a data capture technique for high speed signaling, and more particularly pertains to a technique to allow for optimal sampling of an asynchronous data stream. This technique allows for extremely high data rates and does not require that a clock be sent with the data as is done in source synchronous systems.

The present invention also provides a hardware mechanism for automatically adjusting transmission delays for optimal two-bit Simultaneous Bi-Directional (SiBiDi) signaling.

2. Discussion of the Prior Art

A large class of important computations can be performed by massively parallel computer systems. Such systems consist of many identical compute nodes, each of which typically consist of one or more CPUs, memory, and one or more network interfaces to connect it with other nodes.

The computer described in related U.S. provisional application Ser. No. 60/271,124, filed Feb. 24, 2001, for A Massively Parallel Supercomputer, leverages system-on-a-chip (SOC) technology to create a scalable cost-efficient computing system with high throughput. SOC technology has made it feasible to build an entire multiprocessor node on a single chip using libraries of embedded components, including CPU cores with integrated, first-level caches. Such packaging greatly reduces the components count of a node, allowing for the creation of a reliable, large-scale machine.

The present invention relates to the field of massively parallel computers used for various applications such as, for example, applications in the field of life sciences. More specifically, this invention relates to the field of high speed signaling, to either unidirectional signaling or Simultaneous BiDirectional (SiBiDi) signaling.

There are cases where large data transfers are required but the number of wires that can be used is limited. Simultaneous Bidirectional (SiBiDi) signaling allows the simultaneous transmission and reception of signals using the same wire. This reduces the number of wires by a factor of two. An example where large data transfers are needed but where the number of cables is severely constrained is a large parallel super computer with thousands of processors communicating through wires.

SiBiDi signaling operates by sending data on the same wire as it receives data. Therefore during reception one receives not only the desired data sent from the other end of the wire but also the data that one has just transmitted. Of course this corrupts the desired signal. However, since the data that was just transmitted is known one can "subtract it out". This is done by standard SiBiDi circuitry.

SUMMARY OF THE INVENTION

Accordingly, it is a primary object of the present invention to provide a data capture technique for high speed signaling, particularly to allow optimal sampling and capture of an asynchronous data stream without sending a clock signal with the data stream. The data is captured by sending serial bits of the data stream down a clocked delay line with a series of delay taps, and sampling all of the delay taps with a clock. Each delay tap output is compared with a neighbor delay tap output to determine if it is the same, and the comparisons are used to form a clocked string to generate a data history record which is examined to determine optimal data capture eyes by looking for data capture eyes where the data does not transition between adjacent delay taps, which are detected as optimal data capture eyes.

A further object of the subject invention is the provision of a hardware mechanism for automatically adjusting the transmission delays for optimal two-bit SiBiDi signaling to improve the signal quality of the two-bit SiBiDi signaling. A special hardware algorithm is implemented and each of the two bits is used in unidirectional channels in order to allow the hardware algorithms of the two nodes to safely exchange setting parameters during the set-up sequence. A unidirectional channel of the same frequency has half the bandwidth of the SiBiDi channel but it has considerably better signal quality.

BRIEF DESCRIPTION OF THE DRAWINGS

The foregoing objects and advantages of the present invention for a data capture technique for high speed signaling may be more readily understood by one skilled in the art with reference being had to the following detailed description of several embodiments thereof, taken in conjunction with the accompanying drawings wherein like elements are designated by identical reference numerals throughout the several views, and in which.

Figures 1, 13A:
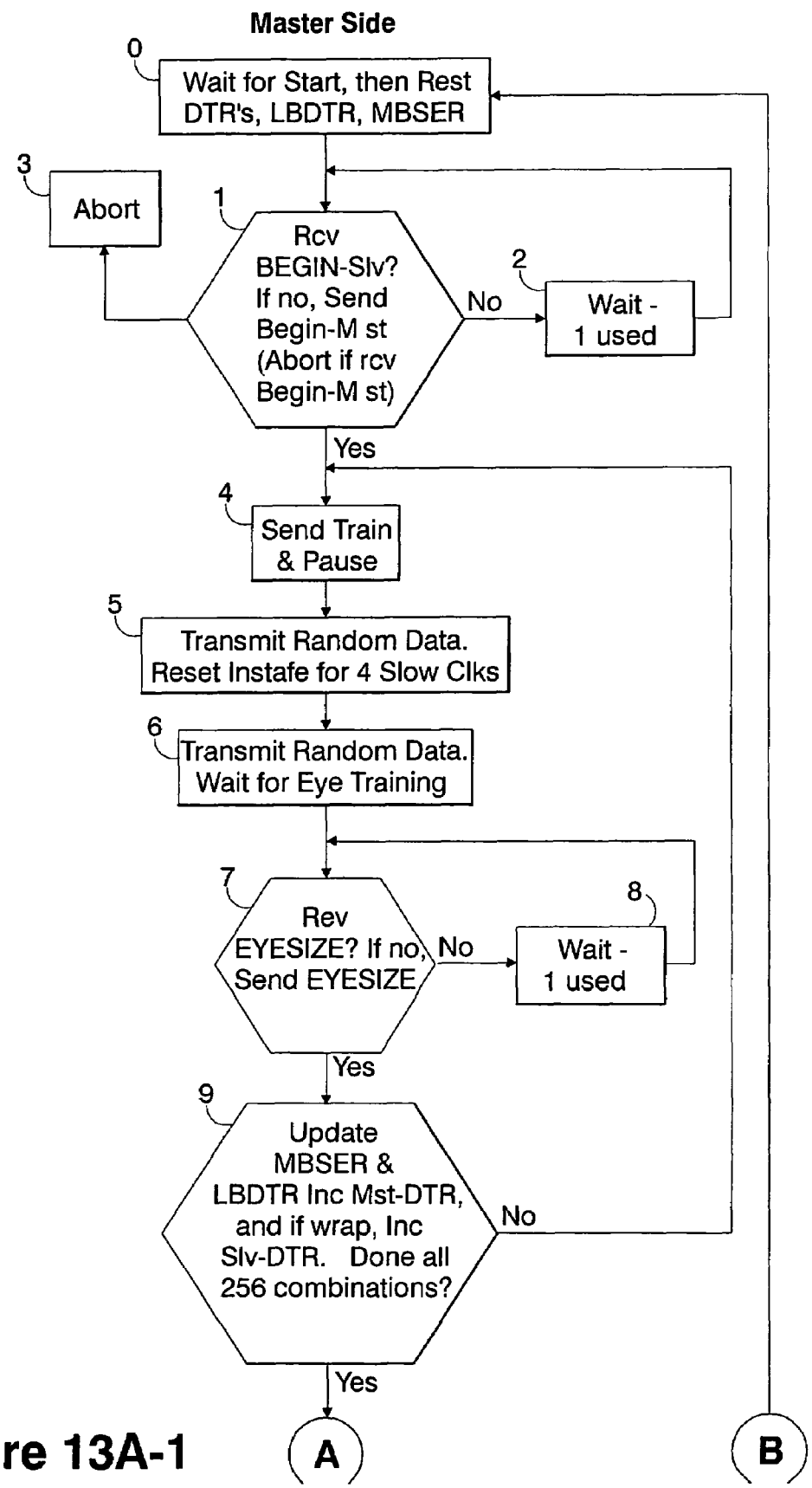
Figures 2, 13A:
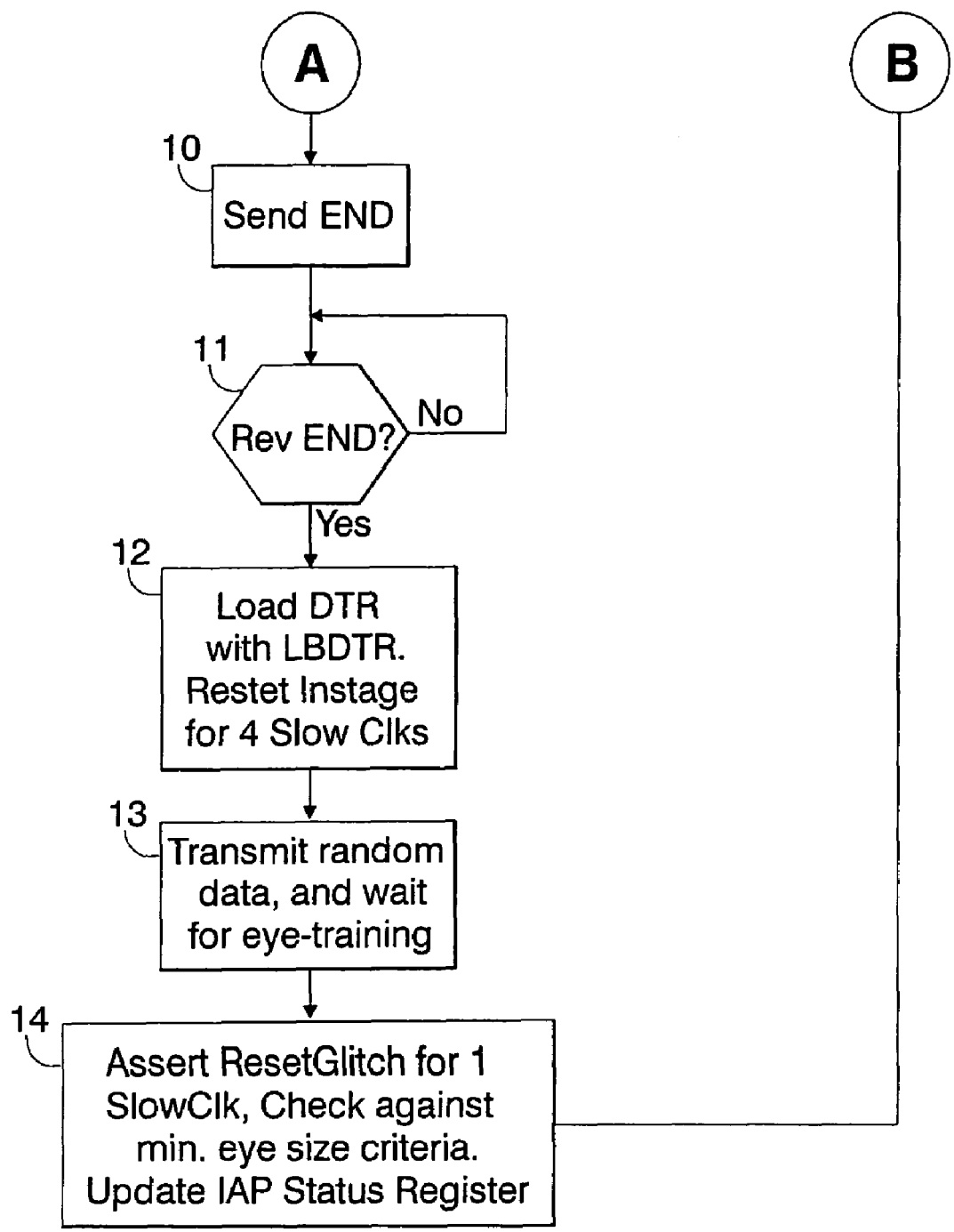
Figures 1, 13B:
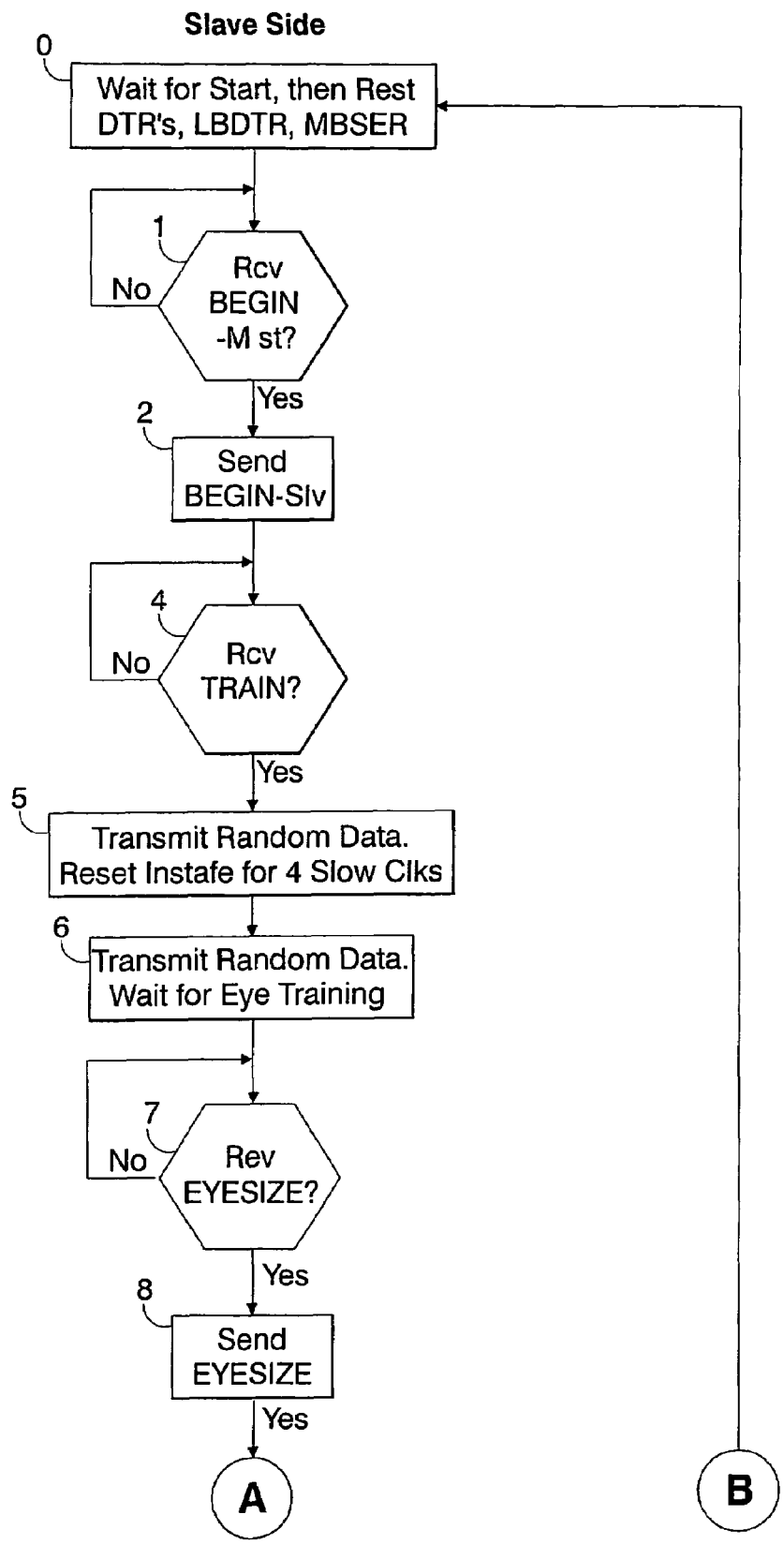
Figures 2, 13B:
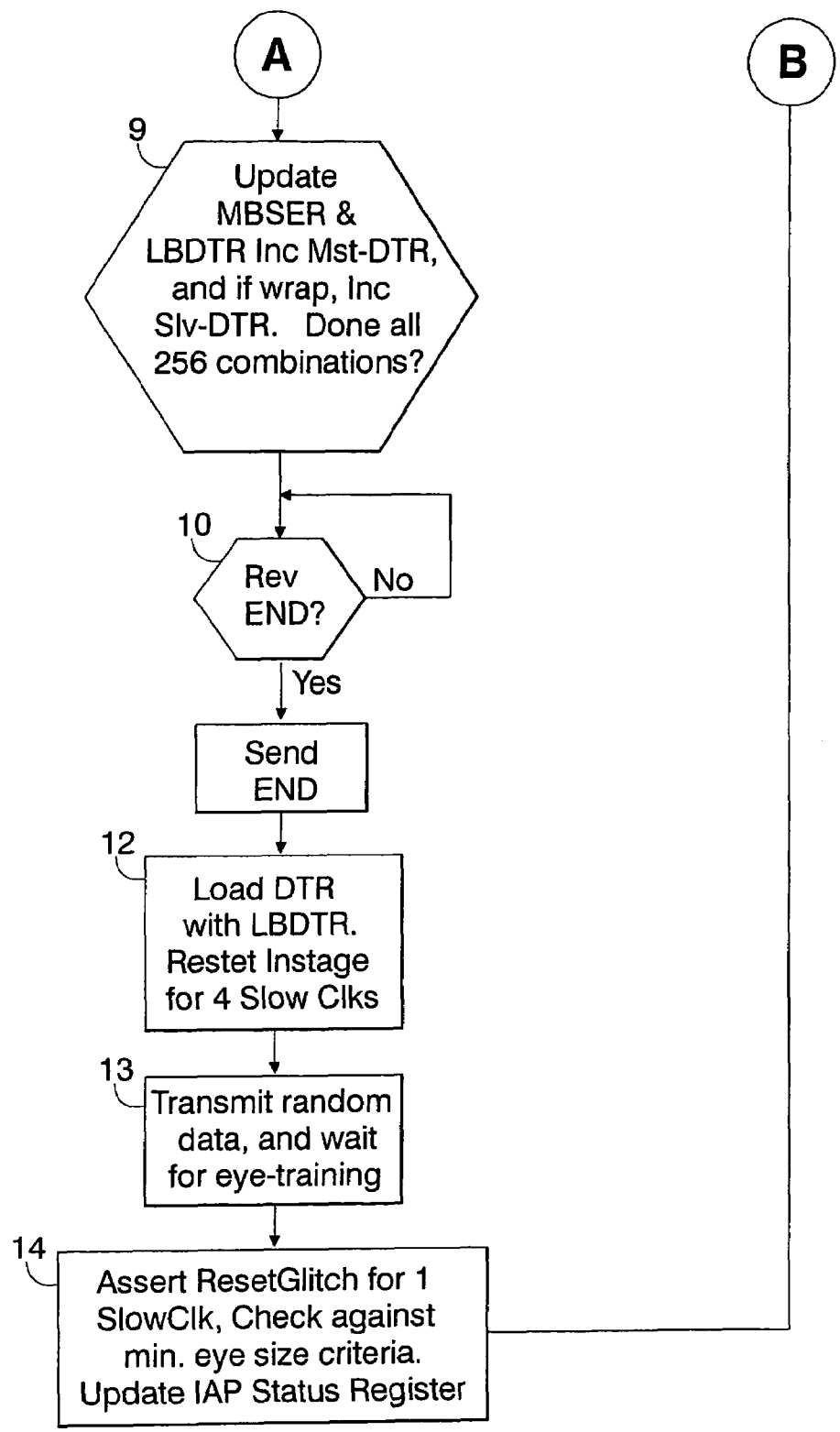

The state machines of FIGS. 13A and 13B illustrate the steps taken by the node compute chip in the training of a synchronous Si-Bi-Di connection.

DETAILED DESCRIPTION OF THE INVENTION

Overview

The present invention is designed to be employed in implementing interconnections in a massively parallel supercomputer which solves two longstanding problems in the computer industry; (1) the increasing distance, measured in clock cycles, between the processors and the memory and (2) the high power density of parallel computers built of mainstream uni-processors or symmetric multi-processors.

The present invention relates generally to a data capture technique for high speed signaling, and more particularly pertains to a technique to allow for optimal sampling of an asynchronous data stream. This technique allows for extremely high data rates and does not require that a clock be sent with the data as is done in source synchronous systems.

Serial Link Investigations

The target bandwidth for serial links connecting nodes of the massively parallel supercomputer is 1.4 Gb/s (each direction). This bandwidth must be bi-directional. The bi-directional requirement can be handled in a number of ways. All cases share the constraint that they be low power and low cost. The implementation of choice will be integrated into an ASIC within a processing node. A particular challenge associated with this approach is the low power constraint. This coupled with the lack of relative phase information for the link transmission eliminates standard PLL clock and data recovery designs. In this case the phase must be extracted from the data itself with high reliability without the use of a PLL.

Digital Data Capture

Overview

Figure 1:
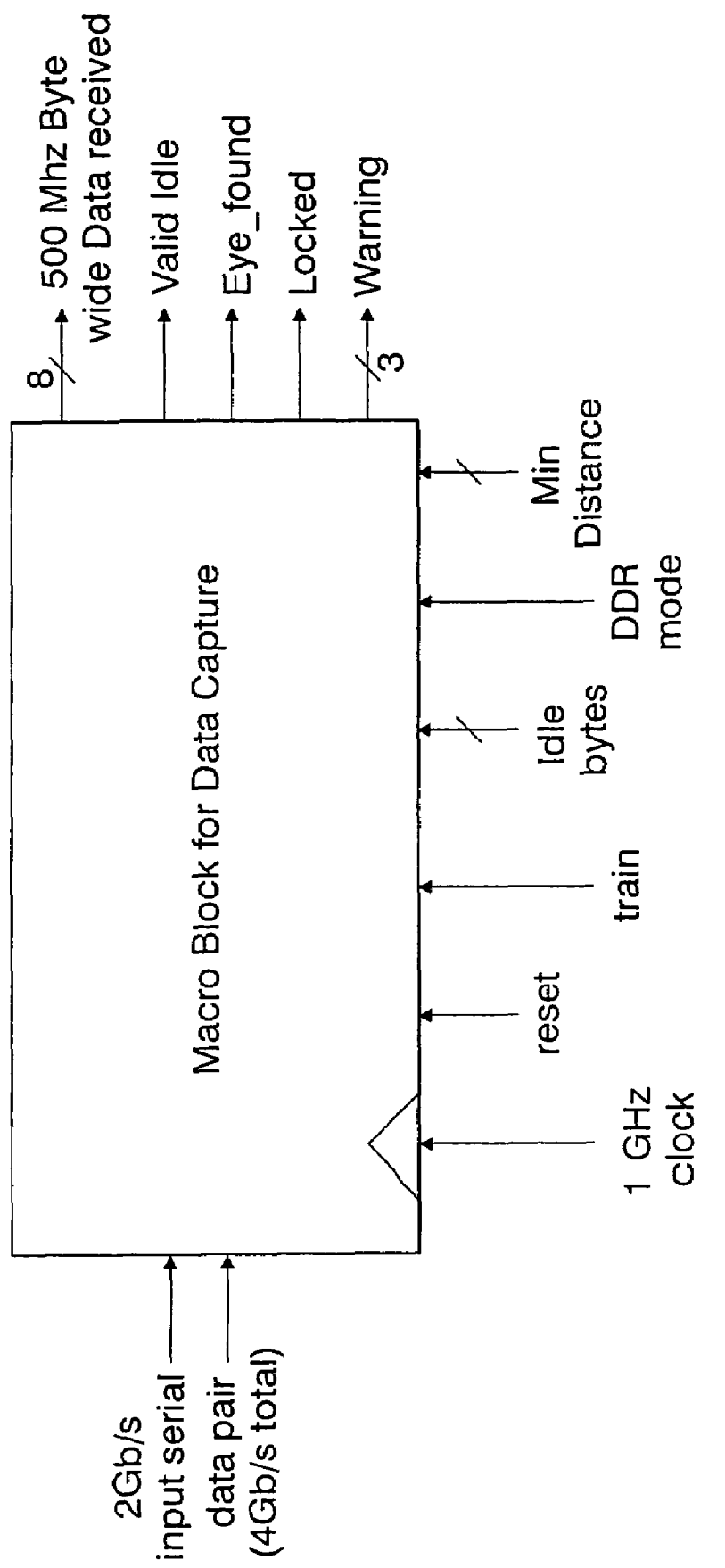
FIG. 1 illustrates a data receive macro that can capture serial data at a 2 Gbit rate and bring it into the local clock domain.
Figure 2:
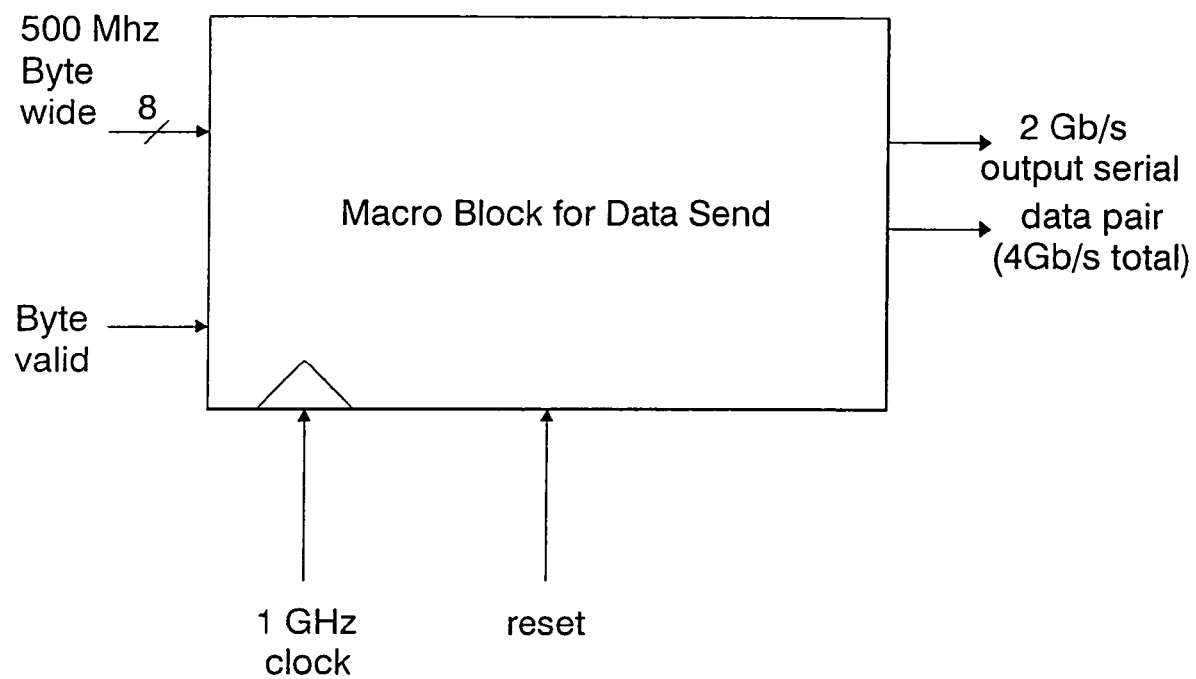
FIG. 2 is a data send macro block which receives a data input 1 byte wide at 500 Mhz, and produces a data output of 2 data streams, each being 2 Gb/s serial data, which is transmitted over a SiBiDi (Simultaneous Bi Directional) differential data link, and is then the data input to the data capture macro of FIG. 1.

This specification describes in detail a digital data capture technique. FIG. 1 illustrates a data receive macro that can capture serial data at a 2 Gbit rate and bring it into the local clock domain. The Goal is to do this reliably with low power utilizing a small number of cells. FIG. 2 illustrates a send macro block that is considerable simpler than the data receive macro. It will be described in the second section of this specification. This describes a DDR (double data rate) style data recovery that allows for an internal clock that is half the frequency of the bit time. This can be utilized in a SDR (single data rate) mode or, extended to a quad data rate scheme if desired.

Referring to FIG. 1, the data input to the data receive macro are two data streams of 2 Gb/s input serial data, which represents a total data stream of 4 Gb/s, and the data output is one data stream, a byte wide (8 bits wide) at 500 Mhz. The other input signals are a 1 Ghz clock, a reset signal which resets the data capture macro to a known state, a train signal directing the macro to find optimal eyes (positions or stages along the multiple tap delay line (see FIGS. 3, 4 and 5) at which data is not undergoing transitions and therefore are likely to be the most accurate data capture positions least likely to have data errors) to recover data, an Idle bytes signal which is a predetermined idle data pattern which is received by the macro when data is not being received, a DDR mode which directs the macro to operate in a double data rate mode, and a Minimum distance which is a constraint parameter to find the optimal data or idle eye. The other output signals include a Valid Idle signal indicating a valid receipt of an idle pattern, an Eye_found signal which indicates that the optimal eye positions and parameters have been detected, a locked signal indicating that the optimal eye position is locked, and a Warning signal indicating that the optimal eye position is in danger of being lost, by being too close to one end of a multiple tap digital delay line.

The macro of FIG. 1 is explained further with reference to FIGS. 3, 4, 5, 6 and 7.

The latency in the receive macro is between 7 and 12 bit times depending on the byte phase of the data. One can reduce the latency to 5 to 6 bit times by skipping the byte output. This is a reasonable approach for signal redriving where data content can be ignored.

FIG. 2 is a data send macro block which receives a data input 1 byte wide at 500 Mhz, and produces a data output of 2 data streams, each being 2 Gb/s serial data, which is transmitted over a unidirectional or SiBiDi (Simultaneous Bi Directional) differential data link as described below, and is then the data input to the data capture macro of FIG. 1. A further input is a Byte valid signal which indicates a valid data signal is being received and is to be sent rather than an idle signal, and further inputs are a 1 GHz clock signal and a reset signal which resets the data send macro to a known state.

Figure 3:
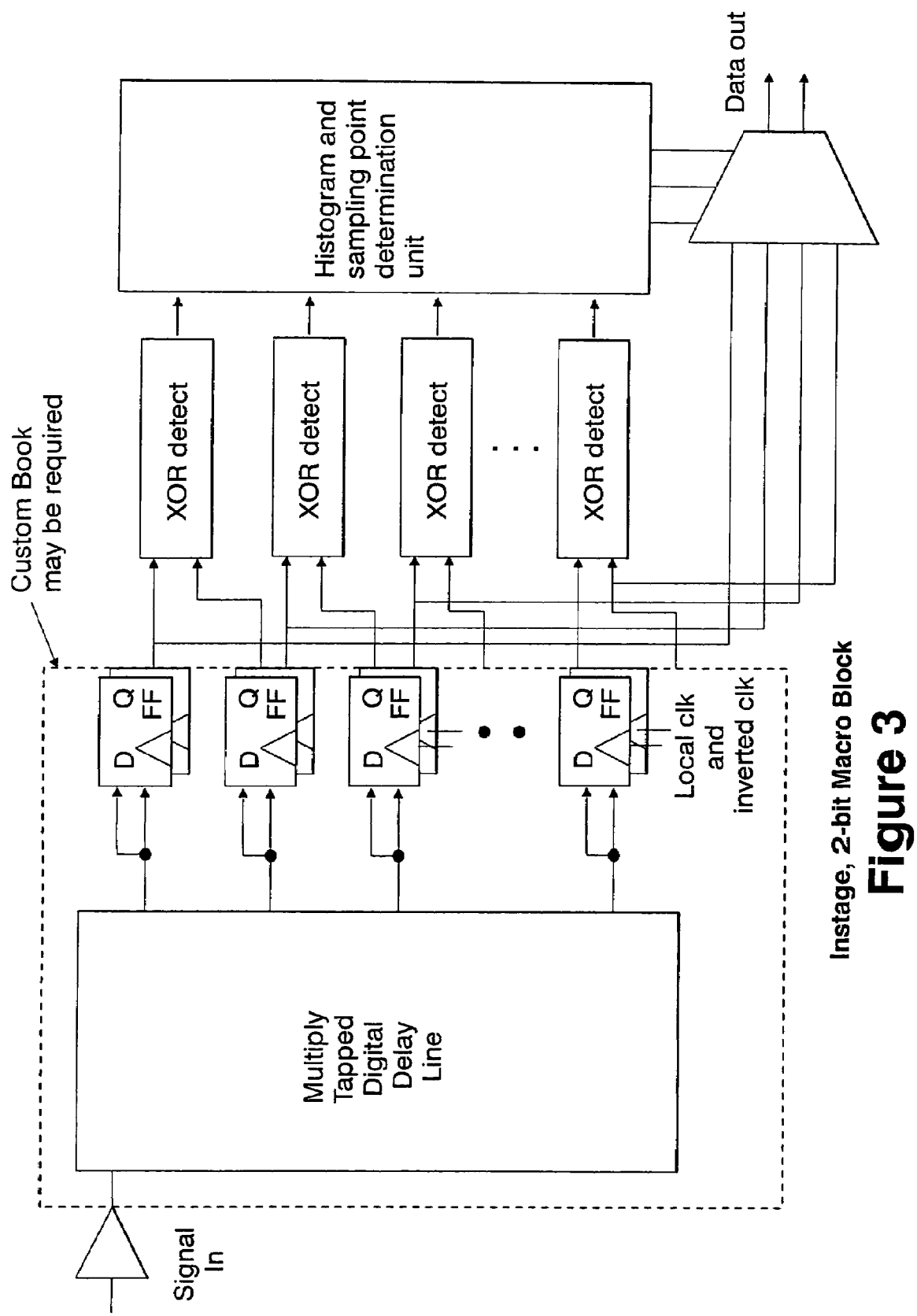
FIG. 3 illustrates an instage, 2-bit macro block.
Figure 4:
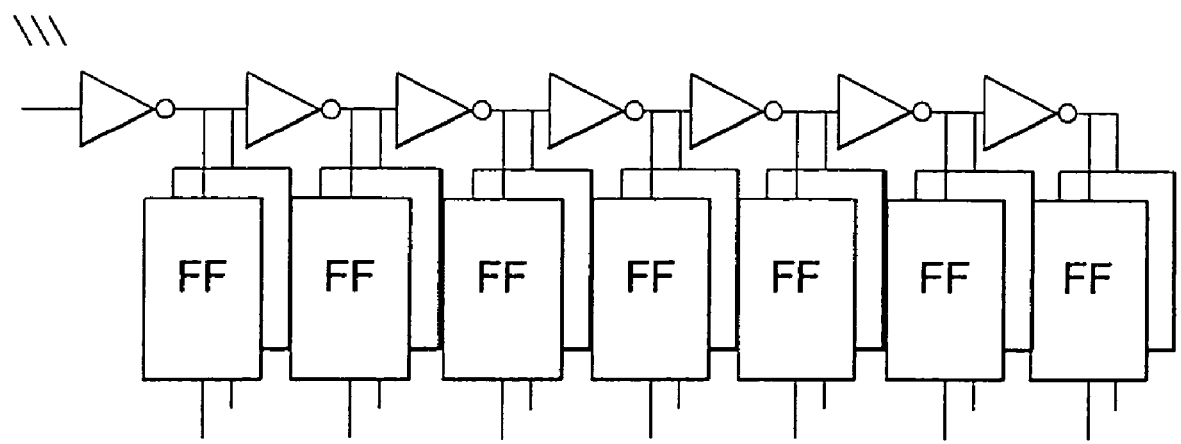
FIG. 4 illustrates an implementation of a clocked delay line wherein serial data passes through a combinatorial series of inverters, each of which adds an increment of delay.
Figure 5:
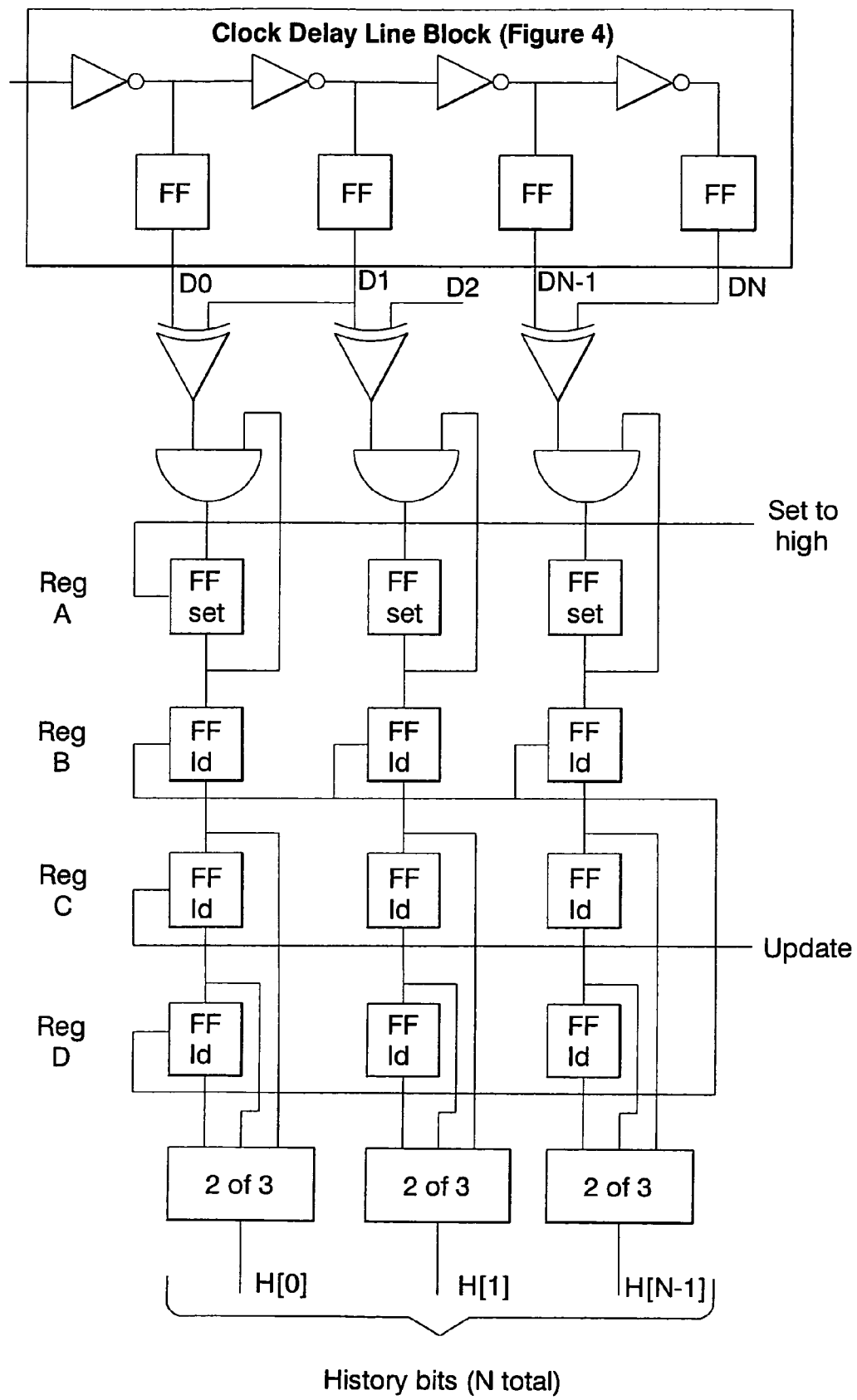
FIG. 5 illustrates a history logic block which is shown as an extension of the clock delay line, and shows one clock phase.

FIGS. 3, 4 and 5 illustrate the data receive and capture. The data is captured by sending the data bits down a fast tapped delay line (see FIGS. 3, 4, 5) and sampling all the taps with the local clock. Each tap is compared with its neighbor (see FIGS. 3, 5) to see if it is the same. The aggregate of these comparisons form a clocked string that is combined with previous clocked strings to generate a history that can be used to determine the optimal sampling points. The optimal sampling points can be found from the history string (see FIG. 5, Registers A, B, C, D) by looking for the regions where the data does not ever change between delay taps, which are referred to herein as "eyes". The history is periodically updated such as every local clock. The periodic update compensates for changing parameters, such as changes in the temperatures or voltages of different components. There will also be three additional "eye" pipelined registers (see FIG. 5, Registers B, C, D) that are infrequently updated. This allows one to develop a capture scheme which has a programmable persistence period as well as being immune to isolated bit errors. The persistence time can be set arbitrarily long but must not be shorter that the maximum time necessary to reliably sample data edges. To accommodate bit sample times faster than the local clock period, both edges of the clock are used to capture DDR data (see FIGS. 3, 4). Each edge of the clock has it's own associated capture registers and independent logic to find the optimal eye. This technique is therefore largely immune to asymmetries in the local and sending side clock duty cycles.

As the history registers will change, the optimal sampling point will also move. This updating should be done on a time scale shorter than the persistence time. This function is done in the histogram and sampling point determination unit.

This method of data capture involves a two stage initialization which proceeds after either a system reset or a separate "train" signal is asserted.

Stage 1: After reset or "train" signals (see FIGS. 1, 2), the history registers are flushed and a new history pattern is acquired in all 3 "eye" registers. After acquiring a valid set of "eye" registers, the best sampling point is determined through a state machine sequence (see FIGS. 9, 10). This is done for each phase of the clock independently. These sampling points then are used and the two bits are forwarded to the next stage every system clock.

Stage 2: The two bits are received and inserted into a shift register, and this shift register is used along with a barrel shifter to allow for appropriate nibble (½ byte or 4 bits) boundaries (see FIG. 7). The boundaries are found through the use of unique idle nibble patterns during the initialization sequence.

The Clocked Delay Line Block:

FIGS. 4 and 5 illustrate an implementation of a clocked delay line wherein serial data enters the left hand inverter I, and passes through a combinatorial series of inverters, each of which adds an increment of delay. At each inverter output there are two register latches FF, FIGS. 3-5, one clocked by the positive edge of the clock, and the other by the negative edge. This allows the logic to capture data at twice the clock rate. One bank of latches captures the data eye for the positive clock phase while the other bank of latches captures the data eye for the negative clock phase. Both eyes are separately detected and sampled, such that each clock phase requires a separate circuit as shown in FIG. 5. The independent positive and negative clocked logic circuits result in very little dependence on the duty cycle of the clock signal, particularly asymmetries in the local and sending side clock duty cycles.

This module has as its input the high-speed signal after the input receiver. The only other input to this module is the local clock that is fanned out equal time to all the flip-flops. The only outputs of this module are N+1 clocked delay taps. D[0:N]. Each tap is to be approximately 50 ps with relatively good matching between rising and falling edges. The matching required between the falling delay versus the rising delay is approximately 20-30%. We require the clocks to be equal time to all neighboring latches to within ~10 ps. This may be better achieved with a tapped clock line rather than a clock tree. Many of these data capture circuits may be implemented so power is critical.

This module is layout critical and therefore requires extra layout consideration.

For test chip purposes, the number of elements is fixed at 32. This gives a nominal total delay of approximately 1.6 nsec, which is enough to capture DDR data at frequencies down to approximately 1 Gb/s.

Referring to FIGS. 3 and 5, and particularly FIG. 5, the output of each register FF (flip flop) is directed to an exclusive OR gate XOR which also receives an input from the next register FF in the delay line. Referring to the first and second stages of the delay line, since the data bit is inverted by the second inverter before it enters the second register FF, if the data bit does not undergo a transition between the two consecutive stages, the first and second registers will hold opposite values, such that the first stage XOR will produce a 1, indicating there was no transition between the stages. Conversely, if the data bit undergoes a transition between the two consecutive stages, the first and second registers will hold the same value, such that the first stage XOR will produce a 0, indicating there was a transition between the stages.

The system of FIG. 5 is searching for a stable position or eye along the clocked delay line to detect the data whereat the data does not undergo transitions, which is indicated by a series of 1 outputs from a series of consecutive XORs, such that the data detection eye should be aligned to the middle of a series of 1s. The output of each XOR is input to an AND gate, the output of which is input to a Register A, which is the first of a series of FF (flip flop) history registers A, B, C, and D. The first register A is sampled at the full 1 Ghz clock rate, and is periodically reset to high by a Set to high signal at a relatively slow clock rate e.g. >1 millisecond (ms) whereas the registers B, C, and D are sampled and updated at the same clock logic rate as Set to high.

The register A is set or reset to a high 1 output by the clock at a >1 ms clock rate, and after a reset if the output of the XOR is a 1, then the output of the AND gate is a 1, and the output of the register A is a 1 which is subsequently clocked (by an Update signal to the load (ld) input of the registers B, C and D) serially through the registers B, C and D. Conversely, if the output of the XOR is a 0, and the output of the Register A is set or reset to 1, then the output of the AND gate is a 0, and register A outputs a 0, which is subsequently clocked serially through the registers B, C and D. The arrangement is such that once the output of register A is a 0, it remains a 0 until the register A is reset by the Set to high signal, such that the outputs of each of registers B, C and D are serially clocked to 0 and remain at 0 until the Register A is reset to a 1 by Set to high signal.

The outputs of each of the history registers B, C and D are input to a 2 of 3 logic element which produces a 1 or high (H) output if any 2 of its 3 inputs are 1s. The purpose of the 2 of 3 logic is to compensate for glitches in the data stream through the digital delay line which might erroneously cause 1 of the 3 inputs to be a 0, such that an accurate output is produced in spite of data glitches. Moreover, the occurrences of a 2 of 3 logic detection can be counted and reported as an indication of the integrity of the data being received. The H outputs (0 to N−1) are inputs to the MUX in FIG. 6C as indicated therein. In general a string of 1s in the H outputs indicates a good candidate for a data sampling eye which should be centered in the middle of the string of 1s.

FIG. 3 illustrates the instage, 2-bit macro block, most of which has been explained with respect to FIG. 5. The Histogram and sampling point determination unit includes the AND gates, history registers and 2 of 3 logics of FIG. 5 and the MUX of FIG. 6C and the State Diagrams of FIGS. 9 and 10. The Macro block also includes an MUX which receives as inputs all of the outputs of the FF registers of the digital delay line, and selectively passes those inputs as Data out under the control of the signals H[0], H[1], H[N−1] at the bottom of FIG. 5.

The History Block:

FIG. 5 illustrates a history logic block which is shown as an extension of the clock delay line block, and shows one clock phase. An identical circuit is required for the other clock phase. The inverter string shown FIG. 5 is common to both clock phases.

Sampling Point Block:

The sampling point block is most easily described by a state diagram that determines the two optimal sampling points, one for each clock phase. As the sampling points will not be updated frequently (at least 50 clocks between updates), we can use a multiple clock process to find the optimal sampling points.

Figure 6A:
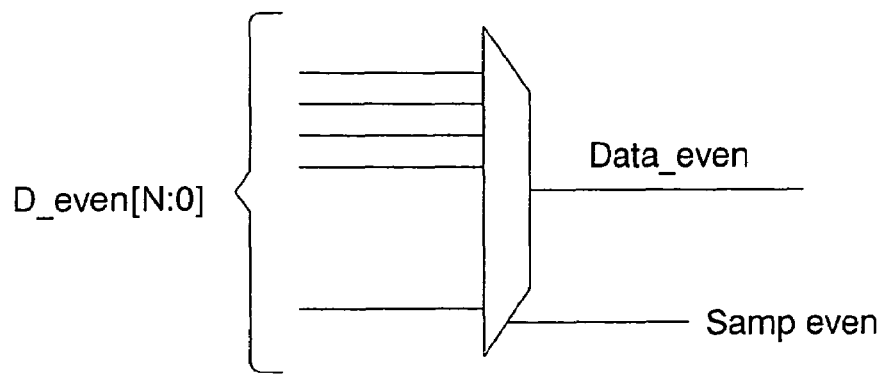
FIGS. 6A and 6B illustrate data and history sample MUXs, each of which corresponds to the MUX shown at the bottom of FIG. 3, one for each of the leading and falling edge clock phases, while the MUX of FIG. 6C receives the output signals at the bottom of FIG. 5.
Figure 6B:
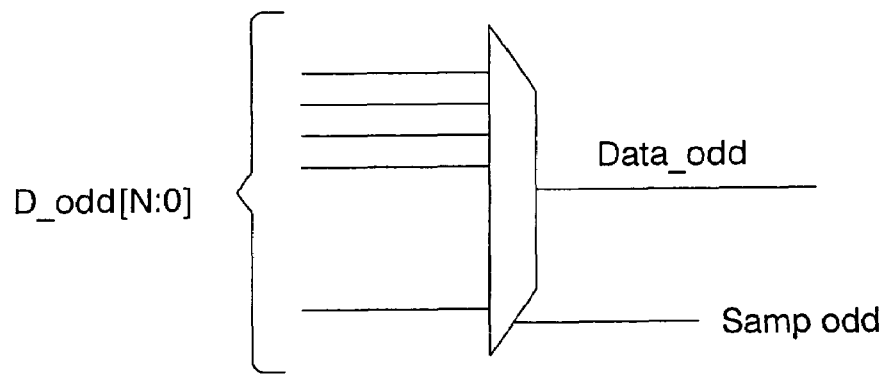
Figure 6C:
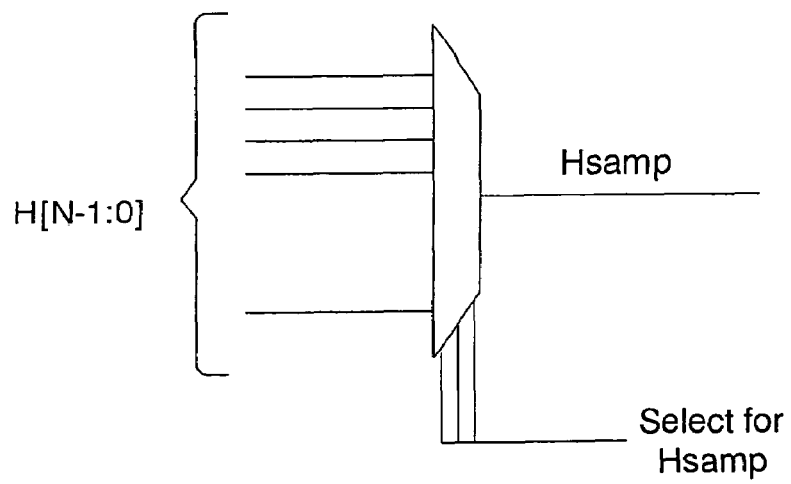

FIGS. 6A and B illustrate data and history sample MUXs, with the sampling MUXs having inputs of respectively D_even[N:0] and D_odd[N:0], each of which correspond the MUX shown at the bottom of FIG. 3, one for each of the leading and falling edge clock phases, while the MUX of FIG. 6C receives the output signals at the bottom of FIG. 5 as explained previously.

Combining Two 2-Bit Macros

Figure 7:
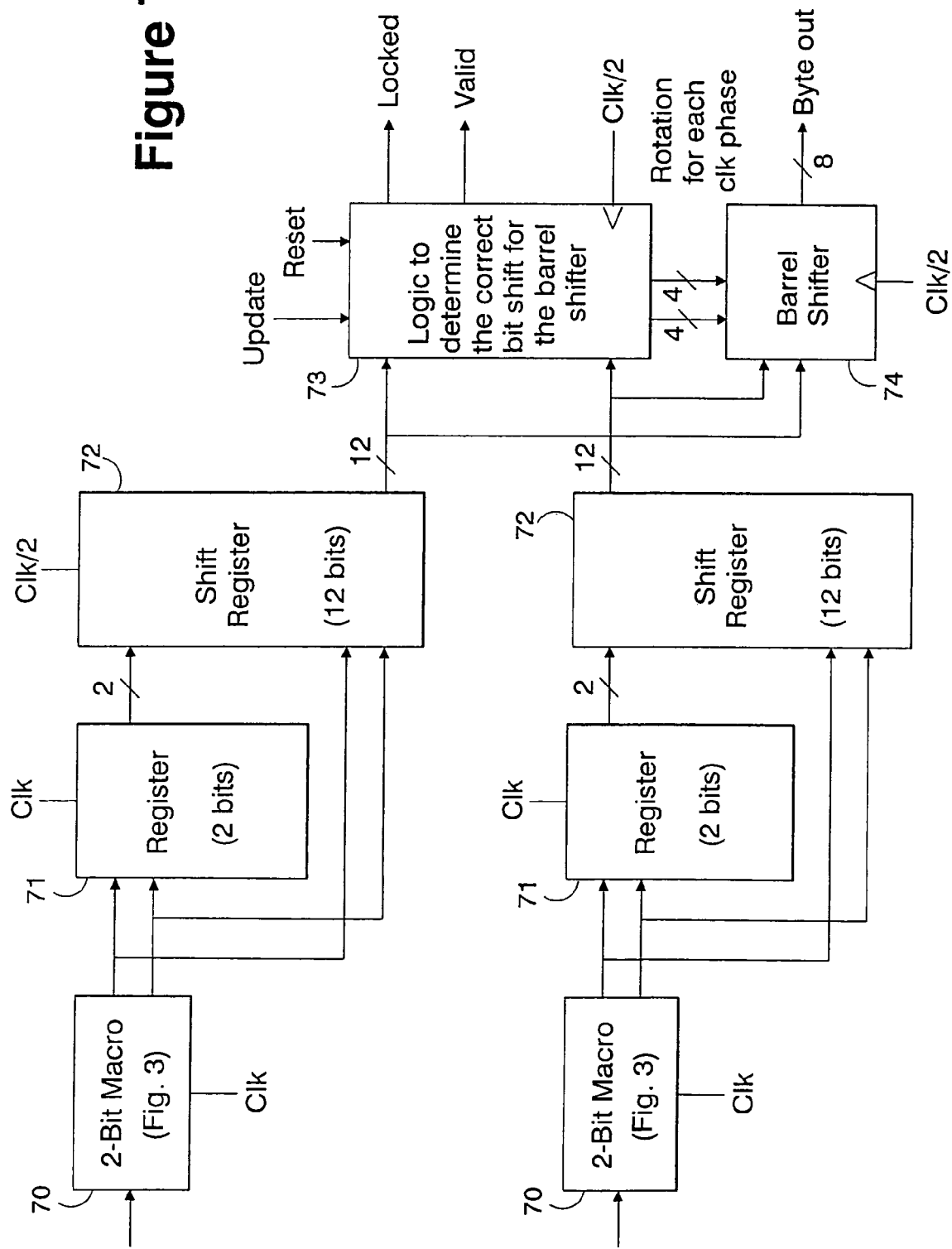
FIG. 7 shows serial bit combining and byte align logic, to be utilized as a paired link capable of capturing 4 data bits per clock cycle, which combines two 2-bit macros (as shown in FIG. 3) and finds the proper byte alignment between the 2 input data streams.

FIG. 7 shows serial bit combining and byte align logic, to be utilized as a paired link capable of capturing 4 data bits per clock cycle, which combines two 2-bit macros (as shown in FIG. 3) and find the proper byte alignment between the 2 input data streams, each at 2 Ghz, input to the two 2-Bit Macros 70 (as illustrated in FIG. 3). The two input signals can be considered to be the input signals of FIG. 1 which are being combined with the proper byte alignment. The outputs of the two 2-bit macros of FIG. 3 are two data streams, each at 1 Ghz, which are input to a Register 71 which delays and standardizes the 2 data streams, which are input to a 12 bit Shift Register 72 which is clocked at half speed Clk/2, which converts the 2 data streams to a 12 bit wide data stream at 500 Mhz. These are input to a logic 73 and a Barrel Shifter 74 which has a 24 bit input of the two 12 bit wide data streams, and essentially selects 8 bits of the 24 bits which are properly aligned, under the control of Logic 73 to determine the correct bit shift for the barrel register. The logic 73 uses a known training pattern to produce two 4-bit wide outputs which control the barrel shifter. The Logic 73 essentially keeps resending the same known data training pattern through the clocked delay line, under software control, until it knows the correct bit shift for the barrel shifter. The Barrel Shifter selectively picks the best 8 properly aligned 8 bits of the 24 bit input, under control of the Logic to pass as the Byte output.

State Diagrams:

Eye Detection Flow

Figure 8:
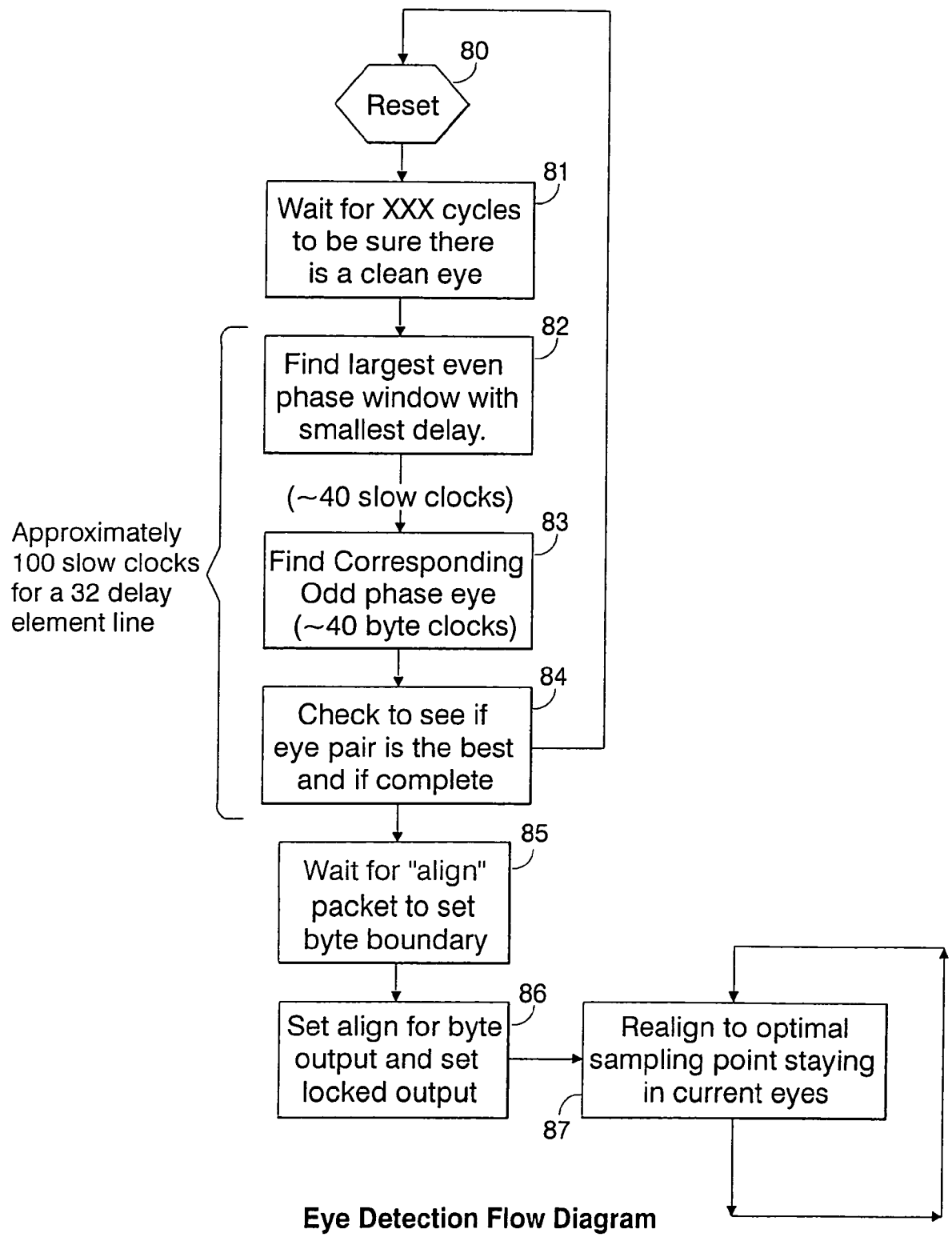
FIG. 8 illustrates the eye detection process in an eye detection flow diagram.

FIG. 8 illustrates the general flow of the eye detection process in an eye detection flow diagram, and starts with a Reset 80 which initializes the system to known values, followed by block 81 which waits for a sufficient number of data transitions to ensure a clean determination of an eye. Block 82 examines the 1s and 0s in the even eye history registers to determine an even eye, corresponding to the rising edge clocked data, and selects a first eye with the smallest delay through the clocked delay line. Block 83 does the same thing with respect to an odd eye, and examines the 1s and 0s in the odd eye history registers to determine an odd eye, corresponding to the falling edge clocked data, and selects an odd eye with the smallest delay through the clocked delay line.

There may be several different even phase and odd phase eyes corresponding to different positions along the delay line, and so after the smallest delay eye is detected, the flow diagram recycles from block 84 to block 82 to find the next pair of eyes with the next largest delay, and the logic control continues recycling to block 82 until the complete length of the delay line has been checked for corresponding even and odd phase eyes. Block 84 compares each next detected eye pair with the best previously detected eye pair, and retains the best eye pair, such that it selects the best eye pair of all of the candidate eye pairs, which function is performed by Logic 73 of FIG. 7.

At this point, Logic 73 then waits in block 85 for an "align" packet, which is a known training pattern such as a known sequence of bits, to establish the byte boundary which is unknown at this point. After the byte boundary is established by the align training pattern by Logic 73 in FIG. 7, then block 86, which also corresponds to Logic 73, sets the align inputs to the Barrel Shifter to align the Barrel Shifter 74 to select and pass the correctly aligned 8 bits as Byte out, and Logic 73 also produces the locked output signal. The Barrel Shifter is then ready during a normal data receive to pass 8 correctly aligned bits as the Byte out.

Block 87 indicates that the data sampling eyes are constantly being updated. A preferred realignment starts at the existing even and odd data sampling eyes, and then looks left and right of the existing eyes to determine the left and right eye edges, and then realigns the center of the even and odd phase eyes between their left and right edges, as explained with reference to FIG. 9.

State Diagram for Training Eye Detection

Figure 9:
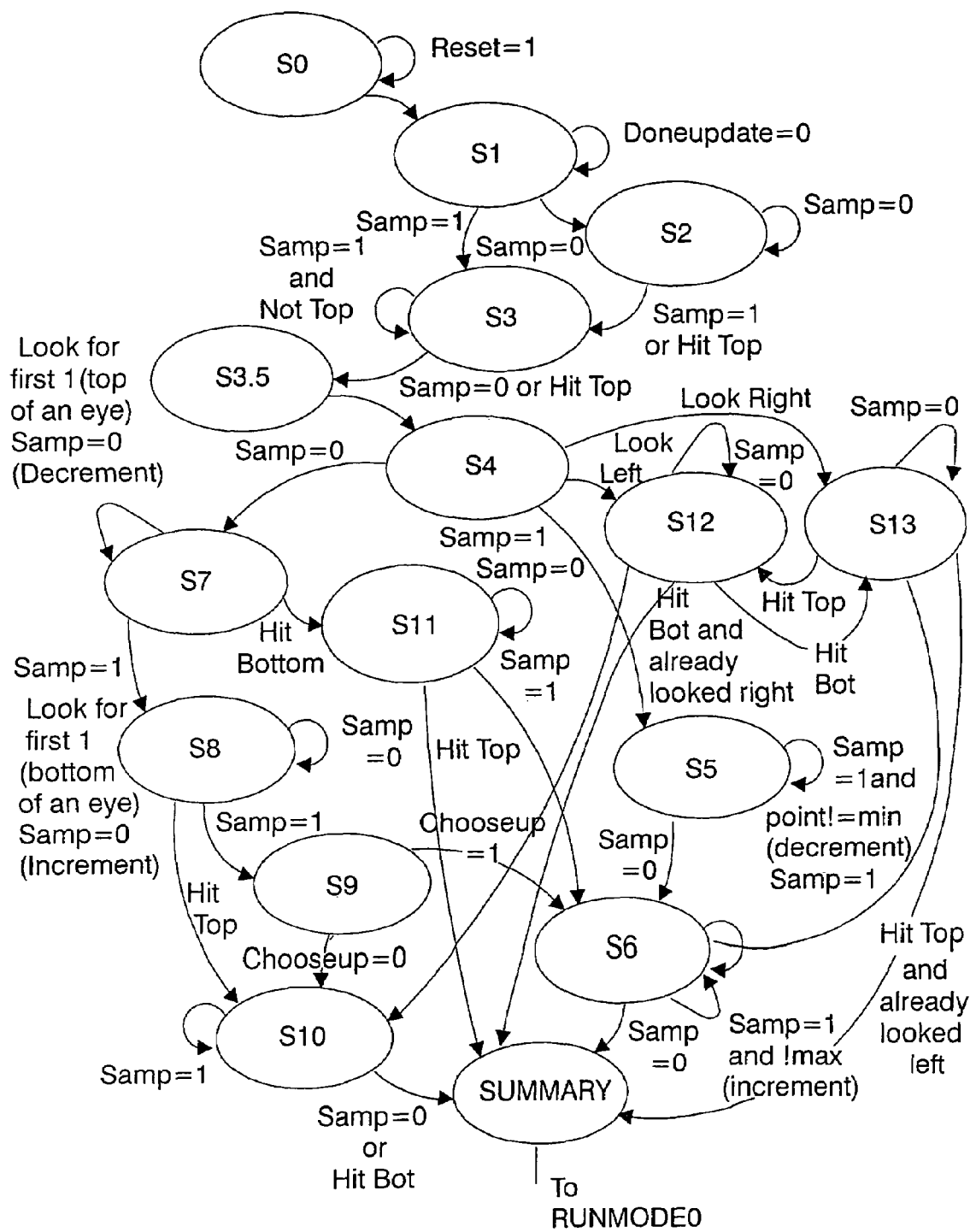
FIG. 9 illustrates a two-bit macro state diagram 1 of 2 which shows the state flow for the phase during which the eye position sample points are being determined.

FIG. 9 illustrates a two-bit macro state diagram 1 of 2 which shows the state flow for the phase during which the eye position sample points are being determined, and corresponds generally to blocks 82 and 83 of FIG. 8.

In FIG. 9, the H[N−1:0] inputs to the MUX of FIG. 6C, which correspond to the outputs at the bottom of FIG. 5, are sampled in sequence and are examined one at a time as the passed output Hsamp of the MUX of FIG. 6C. The first bit H[0], which is either 0, indicating a data transition outside of an eye, or a 1, indicating no data transition possibly inside an eye, is examined in the sequence of steps of FIG. 9, where a 0 is shown as Samp (sample)=0, and a 1 is shown as Samp=1. After the first bit H[0] is examined through all of the steps S0— SUMMARY of FIG. 9, then the second bit H[1] is examined through the same sequence of steps, and etc. until the last bit H[N−1] has been examined.

The states in FIG. 9 in the Two Bit Macro State Diagram 1 of 2 are as follows:

S0 is the reset state. Control remains here while a reset is active.

S1 is an initialization state. After reset is released, the control waits here until an update counter expires, then progresses to S2 if samp=0 ( which indicates that the examined tap of FIG. 5 produces a 0 and so is not in the eye) or S3. is samp=1 (the examined tap output is a 1 and possibly part of an eye).

States S2-S3.5 search for an even eye by incrementally searching through the even delay line history, which corresponds to the rising clock edge clocked data.

S2 searches for an even eye (samp=1) by incrementing through the even delay line history left to right. It finds the left end of an even eye. If found or if it hits the right end of the delay line it goes to state S3, else it stays in S2.

S3 searches for the right end of the even eye, still searching right until it finds samp=0. Control remains in S3 while samp=1 since it is within the eye. When samp=0 is found control goes to S3.5, a delay state necessary for control to work correctly in certain cases.

S3.5 immediately transitions to S4.

States S4-S13 search for the odd eye, which corresponds to the falling clock edge clocked data. The search for the odd eye starts at the detected center of the even eye, and is more complex than the search for the even eye.

S4 begins searching for the odd eye. For a normal mode, if the odd eye samp=0 it progresses to S7, else samp=1 and it progresses to S5. samp=0 means the odd eye is not aligned in the odd delay line history with the even eye and normal strategy is to search left and right picking the closest odd eye. There are two alternative modes. Search right where control goes to S13, or search left where control goes the S12.

S5 means the odd eye is aligned with the even eye and the initial sample point is already in the odd eye. So this state searches left from the initial sample point by decrementing a sample pointer (used to select data points) until it finds the left end of the odd eye or the left end of the delay line. Then control goes to S6.

S6 searches right seeking the right end of the odd eye. When it finds it or the right end of the delay line, control goes to the SUMMARY state, which is the state at the end of the search after step S13, where data sample pointers are set for normal processing of even and odd eyes.

S7 means the odd eye is not aligned with the even eye and the initial sample point is outside any eyes in a noise area. This state searches left for a matching odd eye by decrementing the sample pointer. When samp=1 it has found the right edge of one odd eye which it remembers in MAX (a right edge register) and control goes to S8. Or it reaches the left end of the delay line finding no left odd eye in which case it goes to S11.

S8 is intended to search for an unaligned right odd eye. It continues searching while samp=0 until samp=1 which indicates the left end of a right odd eye is found and remembered in MIN (a left edge register) and control progresses to S9. If the right end of the delay line is reached before finding samp=1, there is no right eye, so control goes directly to left eye processing in S10.

S9 is where the MIN and MAX distance from the even eye is compared. If MIN is closer, control passes to S6. If MAX is closer, control passes to S10.

S10 searches for the left end of the odd eye. Control remains in S10 while samp=1. When samp=0 or the left end of the delay line is reached, control passes to SUMMARY.

S11 searches for an unaligned right odd eye when there is no left odd eye. Control remains in S11 while samp=0. When samp=1, control goes to S6 . If the right end of the delay line is reached before finding samp=1, there are no odd eyes. This is an error condition which is detected and indicated by warning indicators.

S12 searches for an unaligned odd eye left of the even eye in the delay lines. Control remains in S12 while samp=0 and goes to S10 when samp=1. If the left end of the delay line is reached before samp=1 is found, no left eye exist and control opts for looking right in S13, unless control came into S12l from S13, in which case there are no odd eyes. This is an error condition detected and indicated by warning indicators and control goes to SUMMARY.

S13 searches for an unaligned odd eye right of the even eye in the delay lines. Control remains in S13 while samp=0 and goes to S6 when samp=1. If the right end of the delay line is reached before samp=1 is found, no right eye exists and control opts for looking left in S12 unless control came into S13 from S12, in which case there are no odd eyes. This is an error condition detected and indicated by warning indicators and control goes to SUMMARY.

SUMMARY is the state where the eye data sampling points are fixed for normal operation.

State Diagram for Normal Operation with Eye Sample Point Realignment

Figure 10:
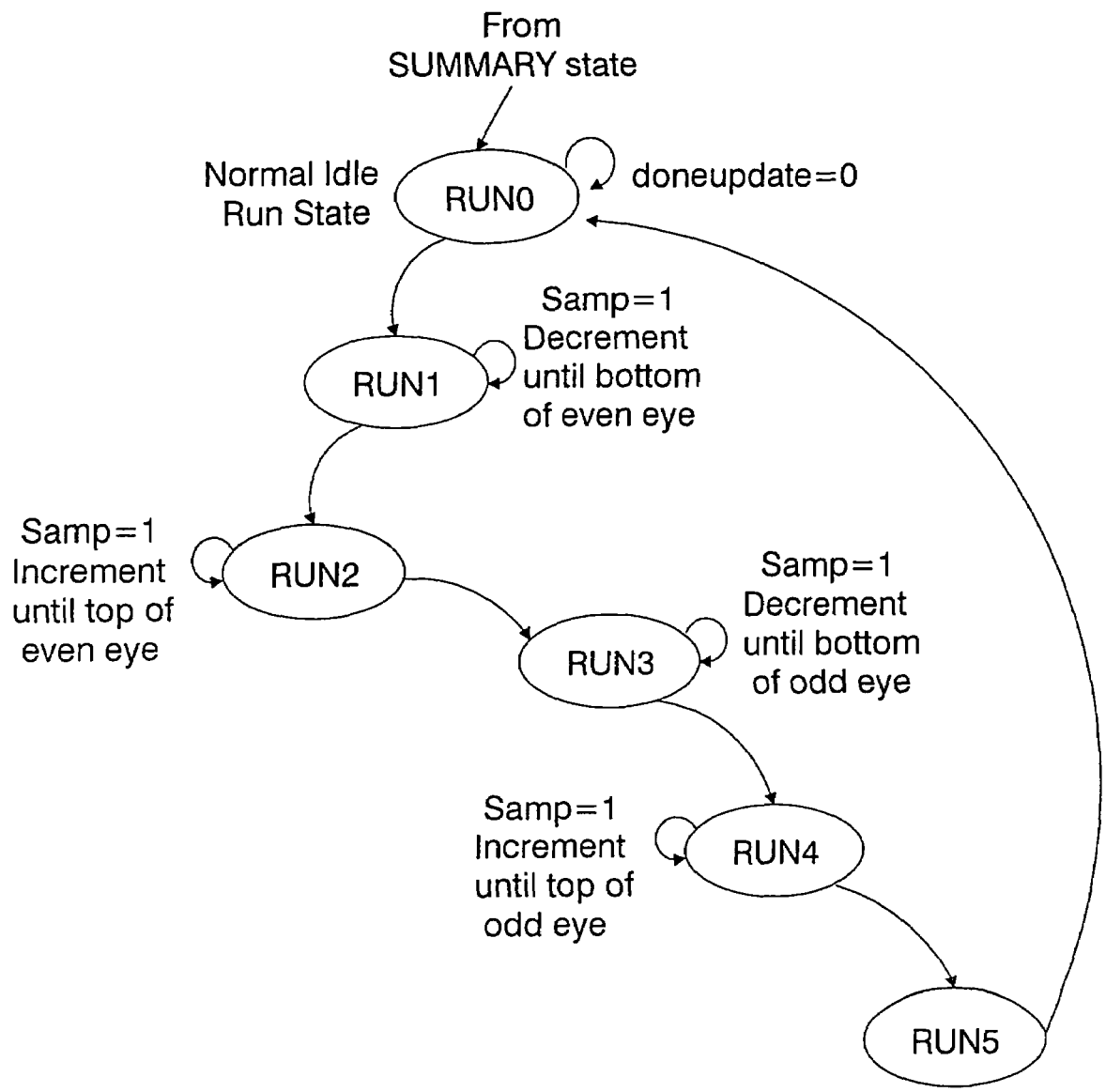
FIG. 10 illustrates a two bit macro state diagram 2 of 2 which shows the repetitive state flow during normal data capture operations.

FIG. 10 illustrates a two bit macro state diagram 2 of 2 which shows the repetitive state flow during normal data capture operations. In this phase, the logic is to capture serial data and convert it to a byte parallel format.

FIG. 10 shows the normal data capture run states. Control normally resides in RUN0. Periodically as determined by a clock counter the done update signal enables control to progress into RUN1. States RUN1 and RUN2 increment and decrement to the extremes of the even eye, which may have changed. The new limits are remembered. Similarly, states RUN3 and RUN4 increment and decrement to the extremes of the odd eye and the limits are remembered. State RUN5 uses the findings of RUN1 through RUN4 to calculate new data sampling points, which get latched into use. Control then returns to RUN0 for another update period.

SiBiDi

The present invention also provides a hardware mechanism for automatically adjusting transmission delays for optimal two-bit simultaneous bidirectional SiBiDi signaling.

The SiBiDi (simultaneous BiDirectional) IOcell "subtraction" of the transmitted signal is more successful if the signal that needs to be subtracted changes at times where the desired received signal does not change. This can be achieved by delaying transmission by an appropriate amount (some fraction of the clock cycle). But delaying transmission at one end means that the data will arrive at the other end delayed. Then the circuitry at the other end will have to readjust its transmission delay so that its own "subtraction" is optimal. Therefore one needs to find a pair of delay settings, one for each circuit at each of the two ends of the wire, so that the "subtraction" gives equally good quality results for both ends.

Furthermore, in order to achieve this, the two ends need to exchange information regarding the quality of the local subtraction for each choice of transmission delay on the other end. But this information cannot be exchanged using the same signaling transmission technique that is being optimized. If a delay setting is bad, it may corrupt the data sent that describe how bad it is. The present invention describes a hardware mechanism for automatically adjusting the transmission delays for optimal two-bit SiBiDi signaling.

Figure 11:
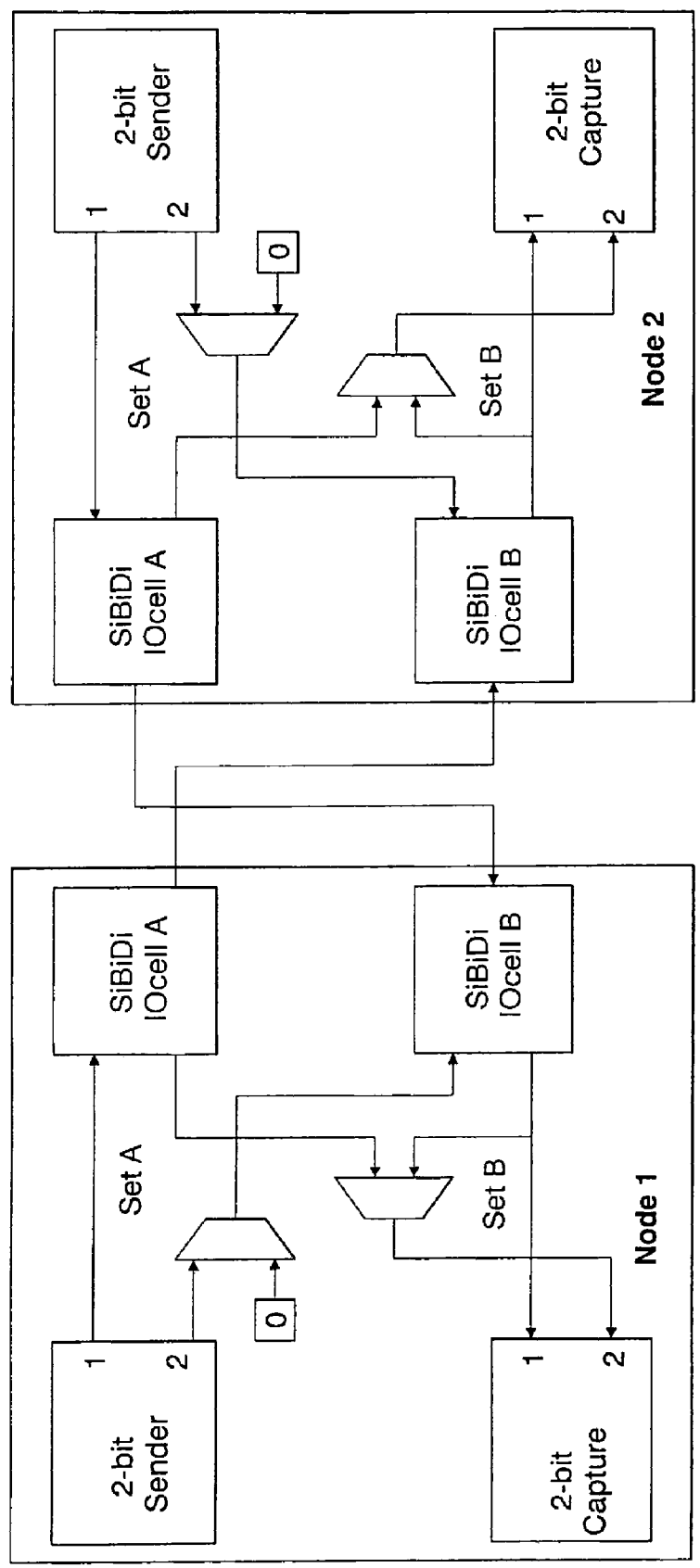
FIG. 11 illustrates a first embodiment wherein two differential data lines connect a pair of identical nodes 1, 2, and wherein each node has a unique ID, and each node operates with a 2-bit sender CPU and a 2-bit capture CPU.

FIG. 11 illustrates a first embodiment wherein two differential data lines connect a pair of identical nodes 1, 2, and wherein each node has a unique ID, and each node operates with a 2-bit sender CPU and a 2-bit capture CPU.

The method uses a "safe communication" set-up phase to communicate the results of each set of transmission delays. The 2 bit sender/capture units are used for safe communication by using a unidirectional setting for the IOcells (wherein transmission is in one direction only to minimize noise) and only one of the 1 bit parts of the units.

FIG. 11 illustrates the electrical connections between a pair of nodes, and shows two differential data lines (each composed of 2 wires to enable differential signaling). The arrows indicate the direction of the unidirectional signals during the safe communication set-up phase. Otherwise, the electrical connections are bi-directional during normal communications.

The Sel A, B boxes are MUX's wherein Sel=0 chooses the upper path from the 2-bit sender unit and to the 2-bit capture unit, and Sel=1 the lower path.

I) Set a READY register (not shown) to 0.
  1) IOcell A=unidirectional transmitter mode.
     IOcell B=unidirectional receiver mode.
     Sel A=1 (chooses upper path).
     Sel B=1 (chooses upper path).
  2) Set sender delay mode to zero delay.
  3) Begin training, which has been described hereinabove to find and detect good data capture eyes.
  4) Save eye parameters for the safe unidirectional set-up phase communication in the middle of a good data capture eye.
  5) Send first bit of ID. In this embodiment, the unique IDs of each of nodes 1 and 2 determine which node is a master and which node is a slave, with the higher ID automatically being the master node.
     Wait until you receive the other node's first bit of ID.
     Compare first ID bits.
     If equal repeat.
     If local is less than neighbor's then set PRIORITY=0
     If local is larger than neighbor's then set PRIORITY=1
  6) IOcell A=SiBiDi mode.
     IOcell B=SiBiDi mode.
     Sel A=0
     Sel B=0
  7) Sender delay mode=0
     Begin training.
     Look for eyes.
     Save local eye parameters.
  8) Go to safe mode as in step 1).
  9) Send your local eye parameters to the other node.
     Receive the other node's eye parameters
  10) Compare the parameters and save the minimum.
  11) Compare current minimum eye parameters with previous minimum eye parameters and save the maximum of the two together with the local sender delay mode of the maximum. This mode is considered to be the optimum mode and is designated as OPT_SENDER_MODE.

In this first embodiment, an 8 tap delay line is assumed, so that each node has a possibility of 8 different delays ranging from zero delay to the maximum delay in 8 steps, so the number of possible combinations is 8×8=64. Stated differently, for each of 8 delays at one node, there are 8 possible delays at the second node. So 64 possible combinations must be tested to select the optimum combination. Step 12 simply cycles through all 64 combinations, one at a time.

Go back to step 6) and repeat for a total of 64 times using the following sender delay mode sequence:
  If PRIORITY=0 then the neighbor changes modes first.
    The local sequence is:
  0 for 8 steps
  1 for 8 steps
  2 for 8 steps
  3 for 8 steps
  4 for 8 steps
  5 for 8 steps
  6 for 8 steps
  7 for 8 steps
  If PRIORITY=1 then the local sequence is:
  0 for 1 step
  1 for 1 step
  2 for 1 step
  3 for 1 step
  4 for 1 step
  5 for 1 step
  6 for 1 step
  7 for 1 step
  Repeat 8 times
  12) Go to SiBiDi operation as in 6) with sender delay mode=OPT_SENDER_MODE.
  13) Set the READY register to 1 to indicate that the system is optimized and ready for normal SiBiDi communications.

If at any step there is a failure so that step 14 is not reached, then the node has failed. The failed node can be identified by the contents of the READY register.

Figure 12:
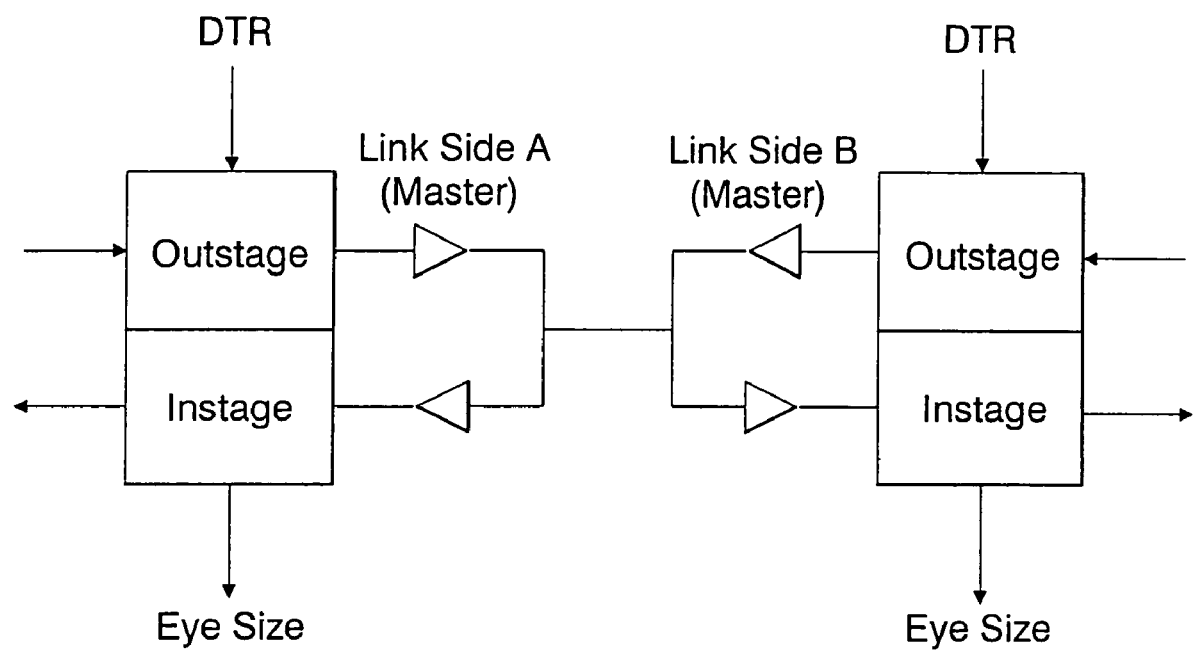
FIG. 12 illustrates a second embodiment of SiBiDi electrical communications between two nodes, Node 1, Node 2, wherein a single differential communication line connects the nodes.

FIG. 12 illustrates a second embodiment of SiBiDi electrical communications between two nodes, Node 1, Node 2, with one distinction from the first embodiment being that a single differential communication line connects the nodes. A second distinction is that this embodiment operates with 1-bit data rather than 2-bit data as in the embodiment of FIG. 11. Another distinction is that in this embodiment, the Master node and Slave node are designated, as by control software, rather than being based upon assigned IDs. This embodiment also assumes a 16 tap delay line rather than an 8 tap delay line as in FIG. 11.

Overview:

An Initial Alignment Procedure (IAP) is a sequence of steps whereby each synchronous signal of each port determines the optimal transmit delay line setting (for its Outstage). The Massively Parallel Supercomputer described in U.S. provisional application Ser. No. 60/271,124 describes a massively parallel computer having 32×32×64 nodes connected as a three dimensional torus wherein each node connects to 6 adjacent nodes. Each node has 6 ports with 20 synchronous signals per port, such that all 120 synchronous signals (6 ports×20 sync signals/port) on a node computer chip at a node of the supercomputer are able to perform this individual training independently. All could occur in parallel, or just one at a time. (all under software control). Training is done on both directions of a SiBiDi link at the same time; which allows for the necessary ISI (Inter Symbol Interference) and near end noise (with environmental noise). Referring to FIG. 12, the high level flow of the IAP Sequence is:

1. Software action: Identifies one side of a synchronous link as "master" and the other side as "slave" by writing to the IAP Control register of each node computer chip.

2. Hardware action: The master side (side A in FIG. 12) communicates with the slave side (side B in FIG. 12) to start the training. This is somewhat complicated since information must be communicated across a link before the link is fully trained. (See "Communication Across an Untrained Link" below)

3. Hardware action: Each side of an individual link has a state machine (as shown in FIGS. 13A and 13B) that runs through all possible delay line settings and compares the results to find the optimal delay line setting. Changing the delay setting on one side influences the eye on both sides, so the system needs to run through all 16×16 combinations. (Note: the Outstage (data send) delay line has 16 settings, as explained previously). For each loop of the delay line training, the Instage (data capture) macro receives a pseudo-random data stream from the other side and seeks to find the eye and presents the eye size information for analysis.

4. Software action: Read the IAP Status registers to determine the success/failure of the training. The exact delay line settings and eye-size margins that were achieved may be read via other link-specific status registers, which are software accessible.

Link Training Sequence:

The state machines of FIGS. 13A and 13B illustrate the steps taken by the node compute chip in the training of a synchronous Si-Bi-Di connection. Each side of the link utilizes the following registers:

DTR—Delay Tap Register—Controls the delay line in the Outstage. (Valid settings are 0-15). Two additional "working" copies are used during the IAP Sequence: Mst-DTR and Slv-DTR.

LBDTR—Local Best Delay Tap Register—Holds the DTR value that corresponds to the best yet seen eye size during the training. At the end of the training, the contents of the LBDTR are permanently loaded into the DTR.

MBESR—Mutual Best Eye Size Register—Holds the best yet seen eye size during the training (based on the minimum of the side A and side B eye sizes for a given step in the training).

Noise generator macros can be enabled during the link training sequence as a way of artificially adding more noise to simulate a very noisy enviroment and guaranteeing more vertical voltage margin, which relates to the size of the eye. Software begins the IAP Sequence by writing the "Start" bit in the IAP Control register, and identifies the chip as Master (side A) or Slave (side B).

Communication Across an Untrained Link:

It is necessary to perform communication between the two sides of a link prior to the link having been fully trained. To ensure the most reliable data transfer possible, the following procedures are utilized:

1) Data is sent in only one direction at a time.
2) Data is sent at a slower data rate. A 1:8 ratio can be used. (i.e. holding a '1' or '0' for eight bit times).

Prior to training, the two sides of a link have no predictable phase relationship. Therefore, if one side transmits a "1 10011", and if the sample point lines up with the switching data, then the data may be received as "111011" or "100011", etc. The transmission rate has to be slow enough to detect stable data across consecutive samples, and not be confused by the mis-samplings that may occur during transitions of 0->1 or 1->0 within the bit stream.

"Commands" sent between the Master and Slave are preceded by a long string of 1's followed by eight 0's. A command will appear as: . . . many ones, 8 zeros, 8 bit times of the first bit of the command, 8 bit times of the second bit of the command, . . . 8 bit times of the last bit of the command. The receiving side detects the 1-->0 transition and estimates the middle of the 8 bit-time window. (In reality, this may be the 3rd, 4th, or 5th bit of the 8 bit-time window; all of which should be stable and valid). Thereafter, every eighth bit is sampled to decipher the command/information.

Referring to FIGS. 13A and 13B, all commands are indicated in capital letters, and "Same" in the blocks of FIG. 13B indicates the same or a corresponding block as in FIG. 13A.

Referring to FIG. 13A, which is the Master side, at stage (0) Wait for a Start software command, then reset the registers DTR's, LBDTR, MBESR. At stage (1) the Master waits to receive a BEGIN command from the Slave, and if not sends a BEGIN to the Slave, and waits to receive a BEGIN reply from the Slave. If not the Master waits and resends BEGIN to the Slave. If the Mater receives a BEGIN from another Master, it aborts.

At stage (4), if Yes, the Master sends a TRAIN command, indicating the Master is about to start synchronization and then pauses.

At stage (5), the Master transmits a random data bit stream to enable capture of the eyes.

At stage (6), the Master waits for capture of the eyes and evaluates information on each eye such as the eye size.

At stage (7), the Master waits to receive data on the eye size, and if not, waits (e.g. 1 usec) and sends data on the eye size and again waits to receive data on the eye size.

When received, the Master updates the MBESR and LBDTR registers and increments the Mst-DTR, and if a wrap (counter overflow) increments the SLv-DTR register, and stages (4)-(9) are repeated for all 256 combinations.

If Yes, at stage (10), the Master sends an END command to end Eye-Training.

At stage (11) the Master awaits receiving an END command from the slave.

If Yes, at stage (12) the Master loads the DTR with LBDTR registers, and resets the instage, which is a set-up node.

At stage (13), the optimal eye parameters are used to transmit random data.

Stages (12) and (13) use optimal eye parameters to transmit data, and then the optimal eye parameters are re-evaluated, and if successful are locked in place.

At stage (14), the Master asserts a Reset Glitch signal to reset and re-evaluate data capture, checks the eye size against minimum eye size data, and updates an LAP Status Register.

The operation of the Slave Side of FIG. 13B should be apparent from the above description of the Master Side.

While several embodiments and variations of the present invention for a data capture technique for high speed signaling are described in detail herein, it should be apparent that the disclosure and teachings of the present invention will suggest many alternative designs to those skilled in the art.

Having thus described our invention, what we claim as new and desire to secure by Letters Patent is:

1. A data capture method to allow optimal sampling and capture of an asynchronous data stream without sending a clock signal with the data stream comprising:

capturing the data by sending serial data bits of the data stream down a clocked delay line with a series of delay taps;

sampling all of the delay taps with a clock;

comparing each delay tap output with a neighbor delay tap output to determine if it is the same;

using the comparisons to form a clocked string to generate a data history record;

examining the data history record to determine optimal data capture eyes by looking for data capture eyes where the data does not transition between adjacent delay taps, which are detected as optimal data capture eyes, wherein the serial data enters the clocked delay line, and is clocked through a combinatorial series of inverters, each of which adds an increment of delay, wherein the clocked delay line comprises a delay tap register at the output of each inverter, and, the output of each delay tap register is directed to an exclusive OR gate XOR which also receives an input from the next delay tap register in the clocked delay line, and since the data bit is inverted by the next delay line inverter before it enters the next delay tap register, and if the data bit does not undergo a transition between the consecutive stages, each delay tap register and the next delay tap register will hold opposite values, such that the XOR gate will produce a 1, indicating there was no data transition between the consecutive stages, and conversely, if the data bit undergoes a transition between the consecutive stages, each delay tap register and the next delay tap register will hold the same value, such that each stage XOR gate will produce a 0, indicating there was a data transition between the consecutive stages, wherein the output of each XOR gate is input to an AND gate, the output of which is input to a first history register, which is the first of a series of four history registers, and the first history register is sampled and reset to high at first clock rate, and the second, third and fourth history registers are sampled and updated at a slower second clock rate.

2. The method of claim 1, wherein the outputs of the XOR gates are sampled in sequence and examined one at a time to determine if each output is either a 0, indicating a data transition outside of an eye, or a 1, indicating no data transition possibly inside an eye, which sequential sampling and examination is repeated in sequence for each delay tap register output.

3. The method of claim 1, wherein the delay tap register outputs are sampled by a first circuit clocked by a positive edge of the clock, and by a second circuit clocked by a negative edge of the clock, an even data capture eye is detected for the positive clock phase, and an odd data capture eye is detected for the negative clock phase, independently of the detection of the even eye.

4. A data capture method to allow optimal sampling and capture of an asynchronous data stream without sending a clock signal with the data stream comprising:

capturing the data by sending serial data bits of the data stream down a clocked delay line with a series of delay taps;

sampling all of the delay taps with a clock;

comparing each delay tap output with a neighbor delay tap output to determine if it is the same;

using the comparisons to form a clocked string to generate a data history record;

examining the data history record to determine optimal data capture eyes by looking for data capture eyes where the data does not transition between adjacent delay taps, which are detected as optimal data capture eyes, wherein the serial data enters the clocked delay line, and is clocked through a combinatorial series of inverters, each of which adds an increment of delay, and each inverter output is directed to even history registers and odd history registers, the even history registers being clocked by a positive edge of the clock, and the odd history registers being clocked by a negative edge of the clock, to allow logic to capture the serial data at twice the clock rate, the even history registers are used to detect an even data capture eye for the positive clock phase, and the odd history registers are used to detect an odd data capture eye for the negative clock phase, and in a first stage, the history registers are periodically reset and flushed and a new history record is acquired, after which the best data eye is determined for each phase of the clock independently, the best data eyes are then used to send and capture data bits which are forwarded to a next stage for every clock cycle;

and in a second stage, the forwarded data bits are inserted into a shift register which is used along with a barrel shifter to select and pass data from rising and falling clock edges into a 2 bit field on the rising edge of the clock.

5. The method of claim 4, including periodically updating the data history record to compensate for changing parameters.

6. The method of claim 4, wherein the clocked string is combined with previous clocked strings to generate the data history record.

7. The method of claim 4, wherein an even eye multiplexer receives all of the outputs of the even history registers and an odd eye multiplexer receives all of the outputs of the odd history registers.

8. The method of claim 4, wherein the history registers include a first history register clocked at a first clock rate and serially arranged second, third and fourth data history eye registers serially receiving the output of the first history register and clocked at a second clock rate.

9. The method of claim 4, including searching for an even data eye, by incrementally searching through the even history registers, to search for leading and ending edges of the even data eye, and the search for the odd eye starts at the detected center of the even eye, and then searches for the leading and ending edges of the odd data eye.

10. The method of claim 4, wherein the data sampling eyes are constantly being updated and realigned, which starts at existing even and odd data sampling eyes, and then looks left and right of the existing eyes to determine the left and right eye edges, and then realigns the center of the even and odd eyes between their left and right edges.

* * * * *